(12) United States Patent  
Devendra et al.

(10) Patent No.: US 8,386,740 B2  
(45) Date of Patent: *Feb. 26, 2013

(54) MODELING MEMORY COMPRESSION

(75) Inventors: Saravanan Devendra, Karnataka (IN);
David Alan Hepkin, Austin, TX (US);
Rajalakshmi SrinivasaRaghavan,
Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 506 days.

This patent is subject to a terminal disclaimer.

(21) Appl. No.: 12/748,921

(22) Filed: Mar. 29, 2010

(65) Prior Publication Data

US 2011/0238943 A1    Sep. 29, 2011

(51) Int. Cl.
*G06F 12/02* (2006.01)
(52) U.S. Cl. ............................................... 711/170
(58) Field of Classification Search .................. None
See application file for complete search history.

(56) References Cited

U.S. PATENT DOCUMENTS

| | | |
|---|---|---|
| 6,349,150 B1 | 2/2002 | Jones |
| 7,190,284 B1 | 3/2007 | Dye |
| 7,281,004 B2 | 10/2007 | Lightstone et al. |
| 7,412,564 B2 | 8/2008 | Wood et al. |
| 2008/0307188 A1* | 12/2008 | Franaszek et al. ............ 711/171 |

OTHER PUBLICATIONS

US 7,432,833, 10/2008 (withdrawn).

* cited by examiner

*Primary Examiner* — Duc Doan
(74) *Attorney, Agent, or Firm* — Garg Law Firm, PLLC; Rakesh Garg; Libby Z. Toub

(57) ABSTRACT

A system, and computer usable program product for modeling memory compression are provided in the illustrative embodiments. A subset of candidate pages is received. The subset of candidate pages is a subset of a set of candidate pages used in executing a workload in a data processing system. A candidate page is compressible uncompressed data in a memory associated with the data processing system. The subset of candidate pages is compressed in a scratch space. A compressibility of the workload is computed based on the compression of the subset of candidate pages. Page reference information of the subset of candidate pages is received. A memory reference rate of the workload is determined A recommendation is presented about a memory compression model for the workload in the data processing system.

7 Claims, 8 Drawing Sheets

MODELING MEMORY COMPRESSION

RELATED APPLICATION

The present invention is related to similar subject matter of co-pending and commonly assigned U.S. patent application Ser. No. 12/611,190 entitled "EXPANDING MEMORY SIZE," filed on Nov. 3, 2009, which is hereby incorporated by reference.

BACKGROUND OF THE INVENTION

1. Field of the Invention

The present invention relates generally to an improved data processing system, and in particular, to managing memory in a data processing system. Still more particularly, the present invention relates to a system, and computer usable program code for modeling memory compression in a data processing system.

2. Description of the Related Art

Data processing systems include memory devices for storing, processing, and moving data. A memory device, or memory, is generally a physical component of a data processing system configured to store data. A memory may also include logical or virtual components, such as a space on a hard disk designated to be used as a part of the memory.

A component of the operating system of the data processing system, such as a memory controller, manages the movement of data in and out of the memory, and generally the operation of the memory. Applications and the operating system can use the memory for storing, processing, or moving data they need for their respective functions.

Data processing systems can be configured in a variety of ways. For example, the components in a data processing system may be configured to operate in a manner such that the data processing system behaves as a single data processing unit. The memory in such a configuration operates to support data manipulation for the single data processing unit.

As another example, data processing systems can be divided into logical partitions (LPARs). Such data processing systems are also known as logical partitioned data processing systems. A logical partition is also known simply as a "partition." Each partition operates as a separate data processing system independent of the other partitions. Generally, a partition management firmware component connects the various partitions and provides the network connectivity among them. A Hypervisor is an example of such partition management firmware.

One or more memory devices may be present in a logical partitioned data processing environment. A partition may access one or more memory devices for manipulating data. Methods exist to address several portions of several memory devices in a manner that the several memory devices appear as a single memory to the applications and the operating system of a partition.

Memory capacity is increasingly becoming a major constraint in modern computing systems. The CPU processing capacity of computer systems is growing at a much faster rate than memory capacity, leading to a smaller ratio of memory to CPU capacity. Thus, memory capacity is increasingly becoming the bottleneck in achieving higher system throughput.

Data compression is a technique used for manipulating data such that a size of storage smaller than the actual size of the data can hold that data. Data compression is used in conjunction with a memory to accommodate more data than the actual size of the memory can hold. For example, 1 Giga Byte (GB) of memory can be made to hold 2 GB of data by suitably compressing the data.

Typically, data is compressed when stored in the memory and uncompressed when an application has to retrieve the data from the memory. Many algorithms for data compression exist and some are suitable for compressing data in memory.

SUMMARY OF THE INVENTION

The illustrative embodiments provide a system, and computer usable program product for modeling memory compression in a data processing system. An embodiment receives a subset of candidate pages. The subset of candidate pages is a subset of a set of candidate pages used in executing a workload in a data processing system. A candidate page is compressible uncompressed data in a memory associated with the data processing system. The embodiment compresses the subset of candidate pages in a scratch space. The embodiment computes a compressibility of the workload based on the compression of the subset of candidate pages. The embodiment receives page reference information of the subset of candidate pages. The embodiment determines a memory reference rate of the workload. The embodiment presents a recommendation about a memory compression model for the workload in the data processing system.

BRIEF DESCRIPTION OF THE DRAWINGS

The novel features believed characteristic of the invention are set forth in the appended claims. The invention itself; however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
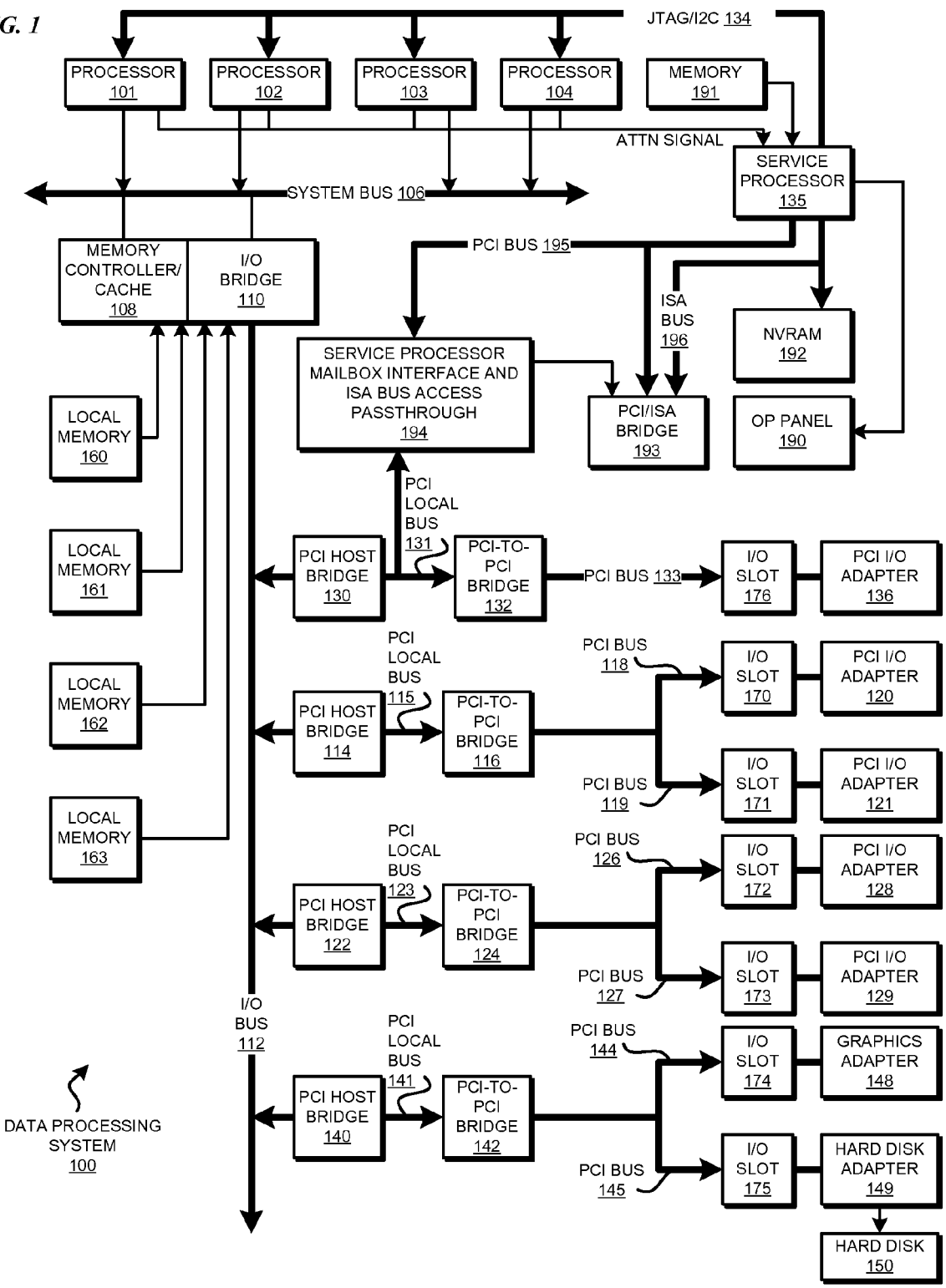
FIG. 1 depicts a block diagram of a data processing system in which the illustrative embodiments may be implemented is depicted.

One presently used method of memory compression extends the virtual memory management capabilities of an operating system or hypervisor to compress and decompress virtual memory pages. This method allows memory compression to be transparent to applications that use the memory. According to this method, a portion of physical memory is set aside to act as a compressed memory pool. The remainder of physical memory acts as the uncompressed memory pool.

Applications can only access uncompressed pages directly. Uncompressed pages are pages of data in the uncompressed memory pool. Conversely, a compressed page is a page of data in the compressed memory pool. When an application attempts to access a compressed page, a page fault is generated, and the operating system or hypervisor must decompress the compressed page into a location in the uncompressed memory pool. To make room in the uncompressed memory pool for these newly uncompressed pages, the operating system or hypervisor must also move some existing uncompressed pages out of the uncompressed memory pool and into the compressed memory pool by compressing those uncompressed pages.

The invention recognizes that the benefits of memory compression can vary widely by workload being processed in a given data processing system. Memory compression generally provides greater benefit to a workload whose data in memory compresses well, to wit, compresses down to a size smaller than a threshold size, as compared to a workload whose data in memory does not compress well, to wit, either does not compress at all or compresses to greater than the threshold size.

The invention further recognizes that the overhead associated with memory compression also varies based on the workload. For example, when a compressed page is referenced, the page must be decompressed. The decompression consumes processor resources and other computing resources. Thus, the more frequently the compressed pages are referenced, the more decompression of the referenced compressed pages, and consequently compression of other pages, occurs, and the more computing resources consumed.

The invention further recognizes that for a workload that has a larger working set than a threshold size of working set, memory compression requires a larger amount of computing resources as compared to a workload that has a smaller than the threshold size of working set. A working set is the collection of data, such as memory pages, referenced by a workload. A large working set may reference a large than a threshold number of pages, including virtual pages, during a period. Conversely, a small working set references a smaller than the threshold number of pages including virtual pages, during a period.

The invention recognizes that due to these and other variables involved with memory compression, determining whether a workload would benefit from memory compression is difficult. The invention also recognizes that calculating the optimal memory compression configuration for a workload is even more difficult even if the compression were beneficial.

For example, without memory compression, a workload may normally use 20 GB of physical memory and 4.2 units of processor resources. A system may have to determine an amount of physical memory that could be saved by using memory compression for the workload. The system may also have to determine an amount of additional processing capacity that will be needed to handle the additional processor and other resources needed for memory compression.

To complicate matters further, as the invention recognizes, the processor costs of memory compression varies based on the amount of physical memory that is configured in the data processing system. In the above example, assume that the working set of the workload could fit in 10 GB of physical memory. When 10 GB of physical memory is allocated to the workload, the CPU usage for memory compression might require five additional units of processor resources due to the amount of decompression activity that occurs to compress 20 GB of data into 10 GB of memory space.

Now assume that 15 GB of physical memory is needed to compress the working set. To perform the compression from 20 GB to 15 GB, the workload may only require one unit of additional processor resources. Accordingly, in this example, using 15 GB for the workload is probably a preferable memory compression configuration because it saves 5 GB of memory through the compression and only costs one additional unit of processor resources.

However, the invention recognizes that arriving at the conclusion that compressing the 20 GB workload to 15 GB is better than compressing to 10 GB requires a significant amount of effort and computing resources because alternative configurations have to be actually configured and tested. Presently, the only way to determine if a workload would benefit from memory compression requires actually enabling memory compression for the workload and monitoring the workload compression in various memory compression configurations.

The invention recognizes that this method of trial and error to determine the optimal configuration of memory compression for the workload is inefficient and wasteful for a number of reasons. For example, the trial and error method is costly both in time and in labor because a user must manually try different configurations and monitor the effectiveness of the different configurations.

As another example, the present method also makes it difficult to quantify the benefit of memory compression because try memory compression must be tried to determine what, if any, benefit it would have for a workload. In other words, the present method works only in systems where memory compression feature is already installed and enabled and not in systems where memory compression feature has to be procured if the feature can benefit the system performance. The benefit of the feature cannot be determined using the present method without actually using the feature first.

The illustrative embodiments used to describe the invention address and solve these and other problems related to data compression in Memory. The illustrative embodiments provide a computer Usable program product, and data processing system for modeling memory Compression. Using the illustrative embodiments, a data processing system, whether or not equipped with memory compression feature, can determine whether memory compression will be beneficial to improve performance under certain workloads.

An embodiment of the invention may make it possible to easily and quickly determine whether an existing workload would benefit from memory compression and to determine a desirable memory compression configuration for the workload.

The examples in this disclosure are used only for the clarity of the description and are not limiting on the illustrative embodiments. Additional operations, actions, tasks, activities, and manipulations will be conceivable from this disclosure and the same are contemplated within the scope of the illustrative embodiments.

The illustrative embodiments are described using specific code, data structures, designs, layouts, schematics, and tools only as examples and are not limiting on the illustrative embodiments. The illustrative embodiments may be implemented with respect to any type of memory, data storage device, or network.

Furthermore, the illustrative embodiments are described in some instances using particular software tools and data processing environments only as an example for the clarity of the description. The illustrative embodiments may be used in conjunction with other comparable or similarly purposed systems, applications, or architectures.

For example, some illustrative embodiments that are described in conjunction with virtualized logical partitioned environments can be used in conjunction with any data processing system where the illustrative embodiments can be implemented in the manner described within the scope of the invention. For example, an operation described with respect to a single memory device in this disclosure can be similarly implemented with respect to more than one memory devices in certain data processing systems without departing the scope of the invention.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
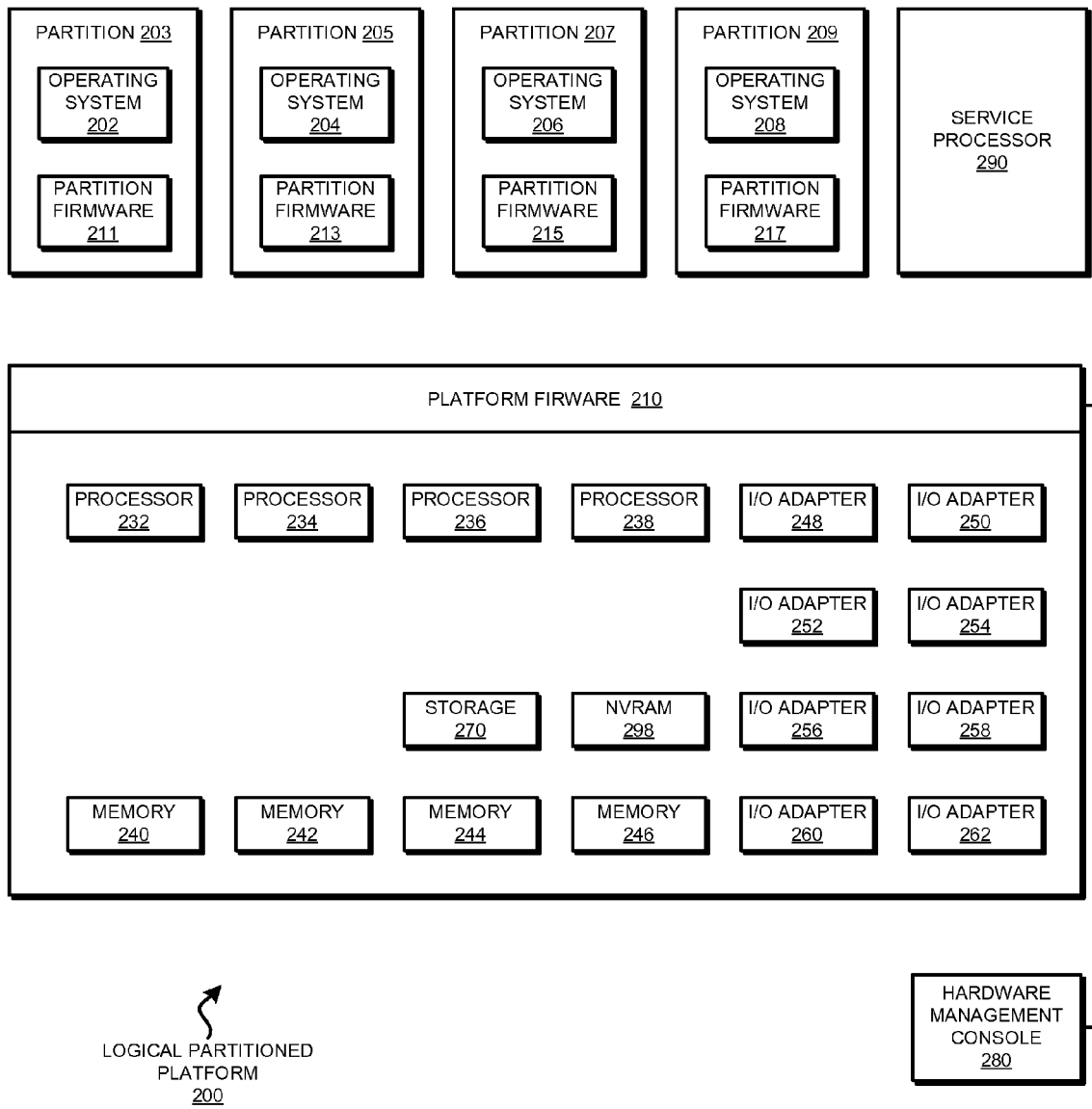
FIG. 2 depicts a block diagram of an example logical partitioned platform in which the illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

With reference to FIG. 1, this figure depicts a block diagram of a data processing system in which the illustrative embodiments may be implemented is depicted. Data processing system 100 may be a symmetric multiprocessor (SMP) system including a plurality of processors 101, 102, 103, and 104, which connect to system bus 106. For example, data processing system 100 may be an IBM Power System® implemented as a server within a network. (Power Systems is a product and a trademark of International Business Machines Corporation in the United States and other countries). Alternatively, a single processor system may be employed. Also connected to system bus 106 is memory controller/cache 108, which provides an interface to a plurality of local memories 160-163. I/O bus bridge 110 connects to system bus 106 and provides an interface to I/O bus 112. Memory controller/cache 108 and I/O bus bridge 110 may be integrated as depicted.

Data processing system 100 is a logical partitioned data processing system. Thus, data processing system 100 may have multiple heterogeneous operating systems (or multiple instances of a single operating system) running simultaneously. Each of these multiple operating systems may have any number of software programs executing within it. Data processing system 100 is logically partitioned such that different PCI I/O adapters 120-121, 128-129, and 136, graphics adapter 148, and hard disk adapter 149 may be assigned to different logical partitions. In this case, graphics adapter 148 connects for a display device (not shown), while hard disk adapter 149 connects to and controls hard disk 150.

Thus, for example, suppose data processing system 100 is divided into three logical partitions, P1, P2, and P3. Each of PCI I/O adapters 120-121, 128-129, 136, graphics adapter 148, hard disk adapter 149, each of host processors 101-104, and memory from local memories 160-163 is assigned to each of the three partitions. In these examples, memories 160-163 may take the form of dual in-line memory modules (DIMMs). DIMMs are not normally assigned on a per DIMM basis to partitions. Instead, a partition will get a portion of the overall memory seen by the platform. For example, processor 101, some portion of memory from local memories 160-163, and I/O adapters 120, 128, and 129 may be assigned to logical partition P1; processors 102-103, some portion of memory from local memories 160-163, and PCI I/O adapters 121 and 136 may be assigned to partition P2; and processor 104, some portion of memory from local memories 160-163, graphics adapter 148 and hard disk adapter 149 may be assigned to logical partition P3.

Each operating system executing within data processing system 100 is assigned to a different logical partition. Thus, each operating system executing within data processing system 100 may access only those I/O units that are within its logical partition. Thus, for example, one instance of the Advanced Interactive Executive (AIM operating system may be executing within partition P1, a second instance (image) of the AIX operating system may be executing within partition P2, and a Linux® or IBM-i® operating system may be operating within logical partition P3. (AIX and IBM-i are trademarks of International business Machines Corporation in the United States and other countries. Linux is a trademark of Linus Torvalds in the United States and other countries).

Peripheral component interconnect (PCI) host bridge 114 connected to I/O bus 112 provides an interface to PCI local bus 115. A number of PCI input/output adapters 120-121 connect to PCI local bus 115 through PCI-to-PCI bridge 116, PCI bus 118, PCI bus 119, I/O slot 170, and I/O slot 171. PCI-to-PCI bridge 116 provides an interface to PCI bus 118 and PCI bus 119. PCI I/O adapters 120 and 121 are placed into I/O slots 170 and 171, respectively. Typical PCI bus implementations support between four and eight I/O adapters (i.e. expansion slots for add-in connectors). Each PCI I/O adapter 120-121 provides an interface between data processing system 100 and input/output devices such as, for example, other network computers, which are clients to data processing system 100.

An additional PCI host bridge 122 provides an interface for an additional PCI local bus 123. PCI local bus 123 connects to a plurality of PCI I/O adapters 128-129. PCI I/O adapters 128-129 connect to PCI local bus 123 through PCI-to-PCI bridge 124, PCI bus 126, PCI bus 127, I/O slot 172, and I/O slot 173. PCI-to-PCI bridge 124 provides an interface to PCI bus 126 and PCI bus 127. PCI I/O adapters 128 and 129 are placed into I/O slots 172 and 173, respectively. In this manner, additional I/O devices, such as, for example, modems or network adapters may be supported through each of PCI I/O adapters 128-129. Consequently, data processing system 100 allows connections to multiple network computers.

A memory mapped graphics adapter 148 is inserted into I/O slot 174 and connects to I/O bus 112 through PCI bus 144, PCI-to-PCI bridge 142, PCI local bus 141, and PCI host bridge 140. Hard disk adapter 149 may be placed into I/O slot 175, which connects to PCI bus 145. In turn, this bus connects to PCI-to-PCI bridge 142, which connects to PCI host bridge 140 by PCI local bus 141.

A PCI host bridge 130 provides an interface for a PCI local bus 131 to connect to I/O bus 112. PCI I/O adapter 136 connects to I/O slot 176, which connects to PCI-to-PCI bridge 132 by PCI bus 133. PCI-to-PCI bridge 132 connects to PCI local bus 131. This PCI bus also connects PCI host bridge 130 to the service processor mailbox interface and ISA bus access pass-through logic 194 and PCI-to-PCI bridge 132.

Service processor mailbox interface and ISA bus access pass-through logic 194 forwards PCI accesses destined to the PCI/ISA bridge 193. NVRAM storage 192 connects to the ISA bus 196. Service processor 135 connects to service processor mailbox interface and ISA bus access pass-through logic 194 through its local PCI bus 195. Service processor 135 also connects to processors 101-104 via a plurality of JTAG/I2C busses 134. JTAG/I2C busses 134 are a combination of JTAG/scan busses (see IEEE 1149.1) and Phillips I2C busses. However, alternatively, JTAG/I2C busses 134 may be replaced by only Phillips I2C busses or only JTAG/scan busses. All SP-ATTN signals of the host processors 101, 102, 103, and 104 connect together to an interrupt input signal of service processor 135. Service processor 135 has its own local memory 191 and has access to the hardware OP-panel 190.

When data processing system 100 is initially powered up, service processor 135 uses the JTAG/I2C busses 134 to interrogate the system (host) processors 101-104, memory controller/cache 108, and I/O bridge 110. At the completion of this step, service processor 135 has an inventory and topology understanding of data processing system 100. Service processor 135 also executes Built-In-Self-Tests (BISTs), Basic Assurance Tests (BATs), and memory tests on all elements found by interrogating the host processors 101-104, memory controller/cache 108, and I/O bridge 110. Any error information for failures detected during the BISTs, BATs, and memory tests are gathered and reported by service processor 135.

If a meaningful/valid configuration of system resources is still possible after taking out the elements found to be faulty during the BISTs, BATs, and memory tests, then data processing system 100 is allowed to proceed to load executable code into local (host) memories 160-163. Service processor 135 then releases host processors 101-104 for execution of the code loaded into local memory 160-163. While host processors 101-104 are executing code from respective operating systems within data processing system 100, service processor 135 enters a mode of monitoring and reporting errors. The type of items monitored by service processor 135 include, for example, the cooling fan speed and operation, thermal sensors, power supply regulators, and recoverable and non-recoverable errors reported by processors 101-104, local memories 160-163, and I/O bridge 110.

Service processor 135 saves and reports error information related to all the monitored items in data processing system 100. Service processor 135 also takes action based on the type of errors and defined thresholds. For example, service processor 135 may take note of excessive recoverable errors on a processor's cache memory and decide that this is predictive of a hard failure. Based on this determination, service processor 135 may mark that resource for deconfiguration during the current running session and future Initial Program Loads (IPLs). IPLs are also sometimes referred to as a "boot" or "bootstrap."

Data processing system 100 may be implemented using various commercially available computer systems. For example, data processing system 100 may be implemented using IBM Power Systems available from International Business Machines Corporation. Such a system may support logical partitioning using an AIX operating system, which is also available from International Business Machines Corporation.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the illustrative embodiments.

With reference to FIG. 2, this figure depicts a block diagram of an example logical partitioned platform in which the illustrative embodiments may be implemented. The hardware in logical partitioned platform 200 may be implemented as, for example, data processing system 100 in FIG. 1.

Logical partitioned platform 200 includes partitioned hardware 230, operating systems 202, 204, 206, 208, and platform firmware 210. A platform firmware, such as platform firmware 210, is also known as partition management firmware. Operating systems 202, 204, 206, and 208 may be multiple copies of a single operating system or multiple heterogeneous operating systems simultaneously run on logical partitioned platform 200. These operating systems may be implemented using IBM-i, which are designed to interface with a partition management firmware, such as Hypervisor. IBM-i is used only as an example in these illustrative embodiments. Of course, other types of operating systems, such as AIX and Linux, may be used depending on the particular implementation. Operating systems 202, 204, 206, and 208 are located in partitions 203, 205, 207, and 209.

Hypervisor software is an example of software that may be used to implement partition management firmware 210 and is available from International Business Machines Corporation. Firmware is "software" stored in a memory chip that holds its content without electrical power, such as, for example, read-only memory (ROM), programmable ROM (PROM), erasable programmable ROM (EPROM), electrically erasable programmable ROM (EEPROM), and nonvolatile random access memory (nonvolatile RAM or NVRAM).

Additionally, these partitions also include partition firmware 211, 213, 215, and 217. Partition firmware 211, 213, 215, and 217 may be implemented using initial bootstrap code, IEEE-1275 Standard Open Firmware, and runtime abstraction software (RTAS), which is available from International Business Machines Corporation. When partitions 203, 205, 207, and 209 are instantiated, a copy of bootstrap code is loaded onto partitions 203, 205, 207, and 209 by platform firmware 210. Thereafter, control is transferred to the bootstrap code with the bootstrap code then loading the open firmware and RTAS. The processors associated or assigned to the partitions are then dispatched to the partition's memory to execute the partition firmware.

Partitioned hardware 230 includes a plurality of processors 232-238, a plurality of system memory units 240-246, a plurality of input/output (I/O) adapters 248-262, and a storage unit 270. Each of the processors 232-238, memory units 240-246, NVRAM storage 298, and I/O adapters 248-262 may be assigned to one of multiple partitions within logical partitioned platform 200, each of which corresponds to one of operating systems 202, 204, 206, and 208.

Partition management firmware 210 performs a number of functions and services for partitions 203, 205, 207, and 209 to create and enforce the partitioning of logical partitioned platform 200. Partition management firmware 210 is a firmware implemented virtual machine identical to the underlying hardware. Thus, partition management firmware 210 allows the simultaneous execution of independent OS images 202, 204, 206, and 208 by virtualizing all the hardware resources of logical partitioned platform 200.

Service processor 290 may be used to provide various services, such as processing of platform errors in the partitions. These services also may act as a service agent to report errors back to a vendor, such as International Business Machines Corporation. Operations of the different partitions may be controlled through a hardware management console, such as hardware management console 280. Hardware management console 280 is a separate data processing system from which a system administrator may perform various functions including reallocation of resources to different partitions.

The hardware in FIGS. 1-2 may vary depending on the implementation. Other internal hardware or peripheral devices, such as flash memory, equivalent non-volatile memory, or optical disk drives and the like, may be used in addition to or in place of certain hardware depicted in FIGS. 1-2. An implementation of the illustrative embodiments may also use alternative architecture for managing partitions without departing from the scope of the invention.

Figure 3:
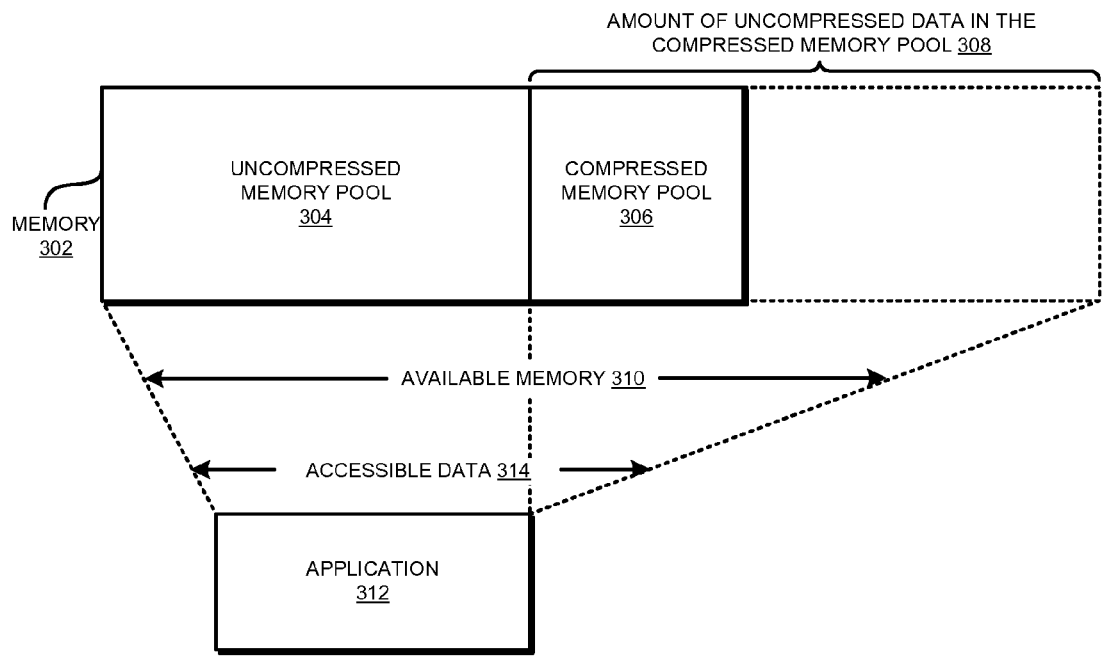
FIG. 3 depicts a block diagram of a memory configuration in accordance with an illustrative embodiment.

With reference to FIG. 3, this figure depicts a block diagram of a memory configuration in accordance with an illustrative embodiment. Memory 302 is depicted as a single block only as a logical view of memory that includes one or more of memory 240, 242, 244, and 246 in FIG. 2.

Memory 302 includes uncompressed memory pool 304 and compressed memory pool 306. Block 308 represents the amount of uncompressed data that is stored compressed in compressed memory pool 306.

Unless the compression ratio of compressed data in compressed memory pool 306 is 1:1, to wit, no compression, block 308 will generally be larger than compressed memory pool 306. For example, assume that the compression ratio of the data in compressed memory pool 306 were 3:1—in other words, the data stored in compressed memory pool 306 was compressed to one third the size of the uncompressed data. Further, assume as an example, that the size of memory 302 was 2 GB and the size of compressed memory pool 306 was 1 GB. For this example, block 308 would represent memory (1 GB*3), or 3 GB in size.

Available memory 310 according to the illustrative embodiment is the total of the size of uncompressed memory pool 304 and block 308. Available memory 310 in the above example would therefore be (2 GB–1 GB) of uncompressed memory pool 304+3 GB of block 308=4 GB of available memory 310 using only 2 GB of memory 302. Available memory 310 is the expanded memory according to the illustrative embodiment.

Generally, the size of the expanded memory according to the illustrative embodiment may be computed as follows:

Expanded memory size=(compression ratio*size of the compressed memory pool)+(actual size of the memory–size of the compressed memory pool).

Expanded memory according to the illustrative embodiment may be addressed, such as by application 312, in any manner suitable for a given implementation. For example, virtual addresses spanning available memory 310 may be used in application 312. Application 312 may access accessible data 314 stored in available memory 310. The virtual addresses may be translated to physical addresses on memory 302 and suitable operations, such as compression or decompression of data, may be performed for physical addresses lying within compressed memory pool 306. Other schemes and mechanisms for addressing available memory 310 will be apparent to those skilled in the art from this disclosure.

Figure 4:
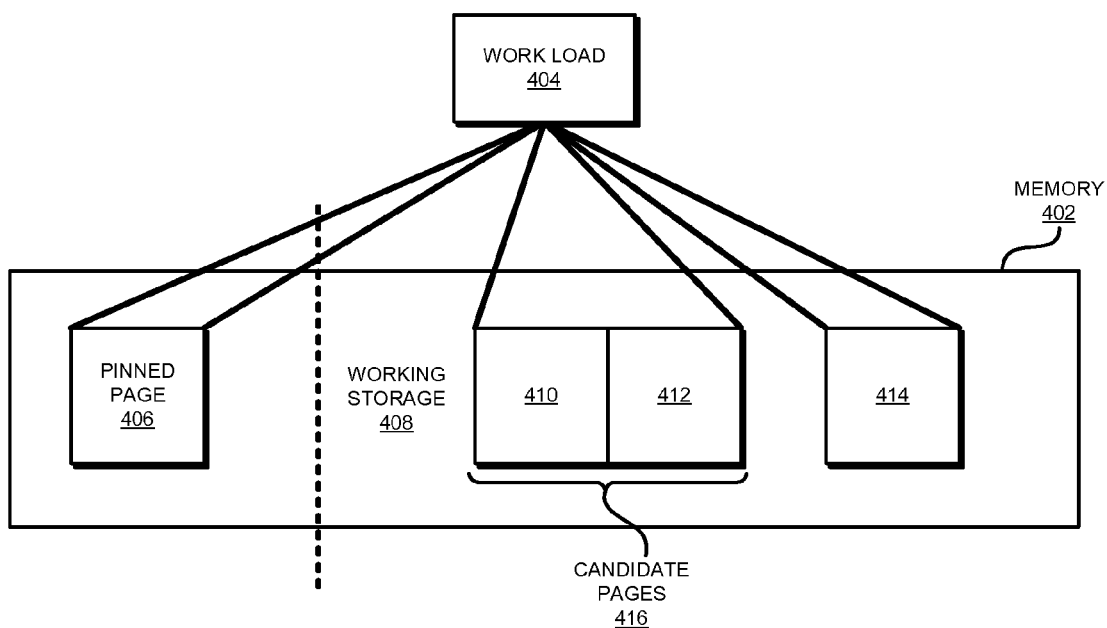
FIG. 4 depicts a block diagram of an example configuration of a memory usable in accordance with an illustrative embodiment.

With reference to FIG. 4, this figure depicts a block diagram of an example configuration of a memory usable in accordance with an illustrative embodiment. In one embodiment, memory 402 may be the uncompressed memory pool of a given memory configuration, such as uncompressed memory pool 304 in FIG. 3. In another embodiment, memory 402 may be the available memory if the memory is not enabled for memory compression in a given data processing system.

Workload 404 may be a workload using memory 402. Workload 404 may be using a fixed area of the memory for storing pinned pages, such as pinned page 406. Working storage 408 may be an area of memory 402 where workload 404 may store pages that can be swapped in and out of memory 402 or can be moved otherwise in memory 402.

Pages 410, 412 and 414 are some example data in working storage 408 that workload 404 uses. Pages 410-414 are called candidate pages 416. A candidate page is compressible data in memory. A set of candidate pages is one or more candidate page.

Figure 5:
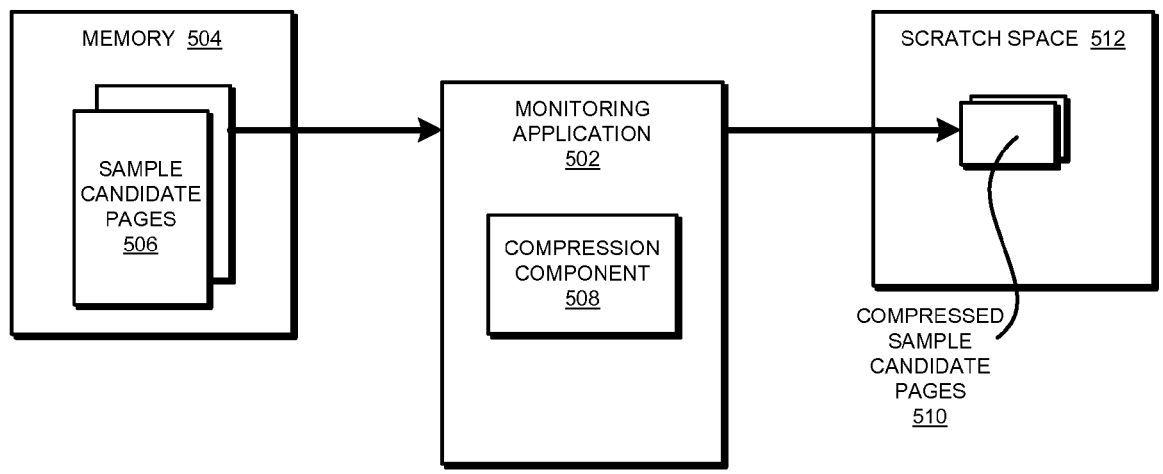
FIG. 5 depicts a block diagram of an example configuration of a monitoring application in accordance with an illustrative embodiment.

With reference to FIG. 5, this figure depicts a block diagram of an example configuration of a monitoring application in accordance with an illustrative embodiment. Monitoring application 502 may be an application of any form, executable in conjunction with a data processing system where memory compression modeling is desired. Monitoring application 502 performs some functions associated memory compression modeling in this embodiment.

Memory 504 may be similar to memory 402 in FIG. 4. Memory 504 may include a set of candidate pages for a workload. Sample candidate pages 506 may be a subset of the set of candidate pages of the workload.

Monitoring application 502 may select any subset of candidate pages as sample candidate pages 506 and may perform the selection in any manner without limitation on the invention. Monitoring application 502 includes compression component 508, configured to compress candidate pages. Compression component 508 may use any suitable compression algorithm for performing the compression without any limitation on the invention.

Using compression component 508, monitoring application 502 compresses sample candidate pages 506 into compressed sample candidate pages 510. Monitoring application 502 uses scratch space 512 for performing the compression computations and for storing compressed sample candidate pages 510. Scratch space 512 may be any data storage area in any data storage device accessible to monitoring application 502. For example, in one embodiment, scratch space may be a portion of memory 504. In another embodiment, scratch space 512 may be a file on a hard disk.

Note that sample candidate pages 506 remain available to the workload in memory 504. The workload continues to access sample candidate pages 506 regardless of monitoring application 502's operations. An operating system or hypervisor may also continue to manipulate sample candidate pages 506 regardless of monitoring application 502's operations.

In so compressing, monitoring application 502 computes the compressibility of sample candidate pages 506. For example, monitoring application 502 may compute the compression ratio of sample candidate pages 506 by determining the size of compressed sample candidate pages 510 in proportion to the size of sample candidate pages 506.

Monitoring application 502 may repeat similar operations and computations several times using same or different subsets of candidate pages of a workload over a period. Monitoring application 502 may determine the compressibility of the workload using the results of several such iterations. For example, monitoring application 502 may average the compression ratios of several iterations to compute an average compression ratio as a measure of the workload's compressibility. As another example, monitoring application 502 may extrapolate the compression ratios of several iterations to compute an expected compression ratio as a measure of the workload's compressibility.

The examples of computing averages or extrapolation are not intended to be limiting on the invention. Monitoring application 502 may be configured to perform any analysis or computation, including any type of statistical analysis, for determining the compressibility of a given workload within the scope of the invention.

Figure 6:
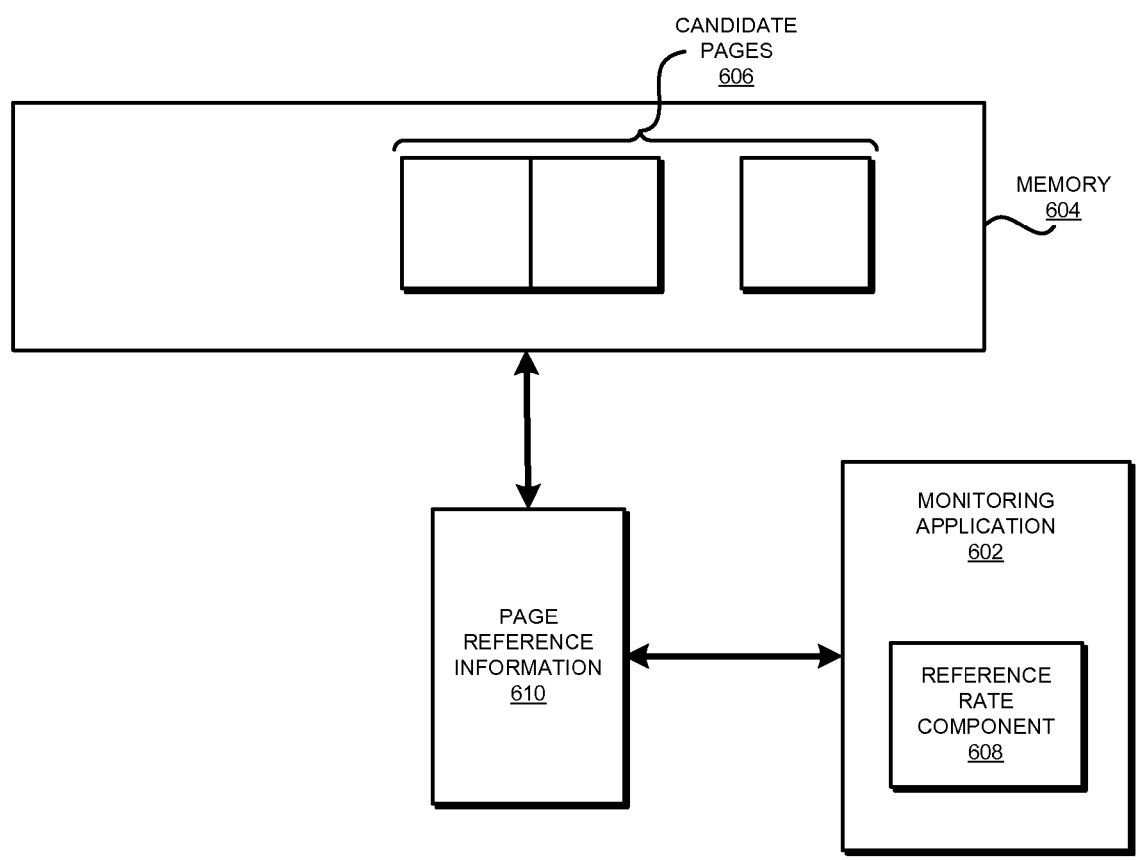
FIG. 6 depicts a block diagram of another example configuration of a monitoring application in accordance with an illustrative embodiment.

With reference to FIG. 6, this figure depicts a block diagram of another example configuration of a monitoring application in accordance with an illustrative embodiment. Monitoring application 602 may be usable as monitoring application 502 in FIG. 5 and may include additional features as described with respect to FIG. 6. Memory 604 may be similar to memory 504 in FIG. 5. Memory 604 may store candidate pages 606 for a workload.

Monitoring application 602 may further include reference rate component 608. Using reference rate component 608, monitoring application 602 may monitor a reference rate of a workload. Reference rate of a page in memory is a measure of frequency of access requested to that page.

Knowing the reference rate of a workload provides an insight into the memory access behavior of the workload. For example, if a workload has a higher than a threshold reference rate for a set of candidate pages, compression of those pages may increase the consumption of computing resources as they will have to be constantly compressed and decompressed. On the other hand, if certain candidate pages, or the workload in general has a lower than threshold reference rate, the workload may incur an overall benefit from memory compression.

Many existing operating systems or memory management components thereof maintain some information about pages in memory that is usable in determining a reference rate of those pages. For example, one operating system may maintain in a virtual memory page table page reference information 610 for a page. Page reference information 610 is usable for determining a reference rate for a given candidate page or subset of candidate pages. An implementation of an embodiment may use any similarly purposed information about pages in memory to determine reference rates of candidate pages.

Again, this operation of monitoring application 602—determining the reference rate of a page—is transparent to the workload whose page's reference rate is being determined. Monitoring application 602 may repeat similar operations and computations several times using same or different subsets of candidate pages of a workload over a period.

For example, in one embodiment, monitoring application 602 may observe the page reference information of a subset of candidate pages for a period. Monitoring application 602 may then reset the page reference information of that subset of candidate pages, and observe the page reference information for that subset again for another period. Monitoring application 602 may so reset and observe the page reference information for a subset of candidate pages several times.

Monitoring application 602 may determine the reference rate of the workload using the results of several such iterations. For example, monitoring application 602 may average the reference rates of several iterations to compute an average reference rate as a measure of the workload's utilization of the memory. As another example, monitoring application 602 may extrapolate the reference rates of several iterations to compute an expected rate of memory access as a measure of the workload's utilization of pages in memory.

The examples of computing averages or extrapolation are not intended to be limiting on the invention. Monitoring application 602 may be configured to perform any analysis or computation, including any type of statistical analysis, for determining the reference rate of a given workload within the scope of the invention.

Figure 7:
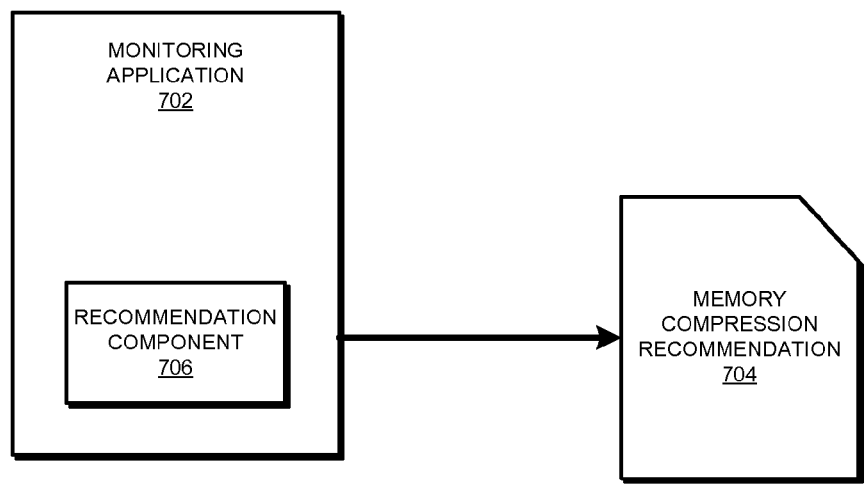
FIG. 7 depicts a block diagram of another example configuration of a monitoring application in accordance with an illustrative embodiment.

With reference to FIG. 7, this figure depicts a block diagram of another example configuration of a monitoring application in accordance with an illustrative embodiment. Monitoring application 702 may be usable as monitoring application 602 in FIG. 6 and may include additional features as described with respect to FIG. 7.

Based on the compressibility and reference rate computations performed according to embodiments of FIGS. 5 and 6, monitoring application 702 may make memory compression recommendation 704. Recommendation component 706 in monitoring application 702 may perform the function of making recommendation 704. For example, recommendation component 706 may accept inputs for various threshold values, number of iterations, selection criteria for selecting candidate pages, and other configuration parameters for performing the various operations and computations of monitoring application 702.

The computation of compressibility in FIG. 5 and the computation of reference rate in FIG. 6 are described only as examples. Any factor usable in modeling memory compression is configurable for computation in a monitoring application of an embodiment in a similar manner within the scope of the invention.

For example, an implementation may consider a number of page faults generated by a workload a factor in determining the workload's benefit from memory compression. Accordingly, such an implementation may configure a monitoring application according to an embodiment to receive page fault information associates with a workload and use such information in making the recommendation according to FIG. 7. Many other factors usable in modeling memory compression will be apparent from this disclosure and the same are contemplated within the scope of the invention.

Figure 8:
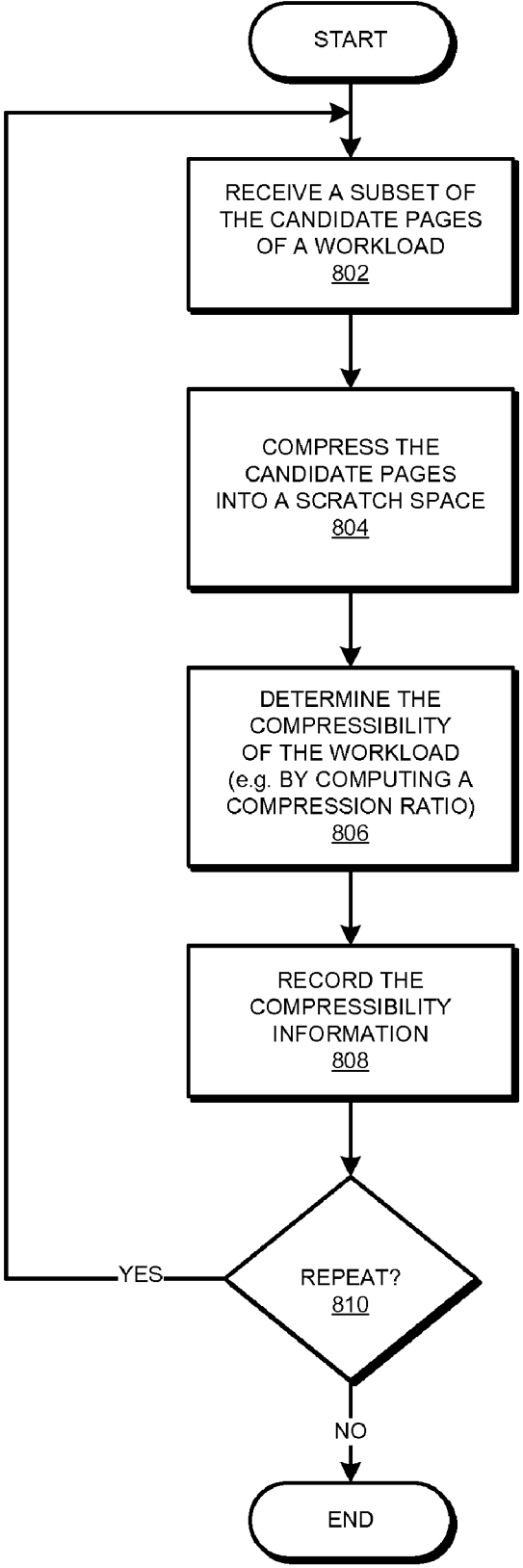
FIG. 8 depicts a flowchart of a process of determining compressibility of a workload in accordance with an illustrative embodiment.

With reference to FIG. 8, this figure depicts a flowchart of a process of determining compressibility of a workload in accordance with an illustrative embodiment. Process 800 may be implemented in a monitoring application, such as any of monitoring applications 502 in FIG. 5, 602 in FIG. 6, or 702 in FIG. 7.

Process 800 begins by receiving a subset of candidate pages of a workload (step 802). Process 800 compresses the received candidate pages into a scratch space (step 804). Process 800 may use any compression algorithm in performing step 804. Process 800 determines a compressibility of the workload (step 806). For example, process 800 may determine the compressibility by computing a compression ratio of the candidate pages. Process 800 records the compressibility information (step 808).

Process 800 determines whether to repeat or perform another iteration of process 800 (step 810). If process 800 determines that process 800 should be repeated ("Yes" path of step 810), process 800 returns to step 802. If process 800 determines that process 800 should not be repeated ("No" path of step 810), process 800 ends thereafter.

Figure 9:
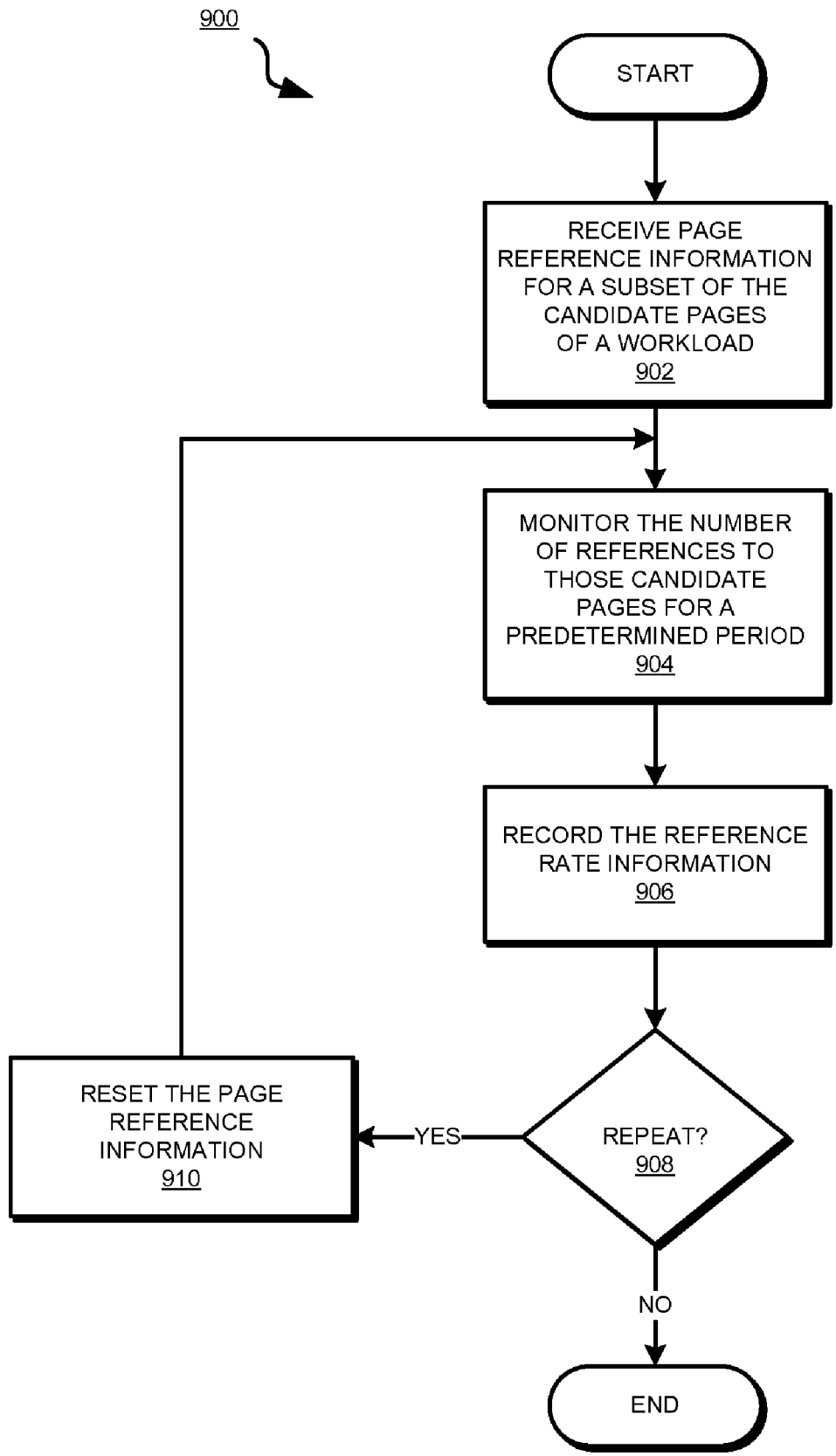
FIG. 9 depicts a flowchart of a process of determining a memory reference rate of a workload in accordance with an illustrative embodiment.

With reference to FIG. 9, this figure depicts a flowchart of a process of determining a memory reference rate of a workload in accordance with an illustrative embodiment. Process 900 may be implemented in a monitoring application, such as any of monitoring applications 502 in FIG. 5, 602 in FIG. 6, or 702 in FIG. 7.

Process 900 begins by receiving page reference information of a subset of candidate pages of a workload (step 902). Process 900 monitors the number of references to those candidate pages for a predetermined period (step 904). Process 900 records the reference rate information (step 906).

Process 900 determines whether to repeat or perform another iteration of process 900 (step 908). If process 900 determines that process 900 should be repeated ("Yes" path of step 908), process 900 resets the page reference information for the subset of candidate pages (step 910). Process 900 returns to step 902. If process 900 determines that process 900 should not be repeated ("No" path of step 908), process 900 ends thereafter.

In one embodiment, process 900 may repeat with a different subset of candidate pages. Accordingly, process 910 may reset the page reference information for that different subset of candidate pages in step 910.

Figure 10:
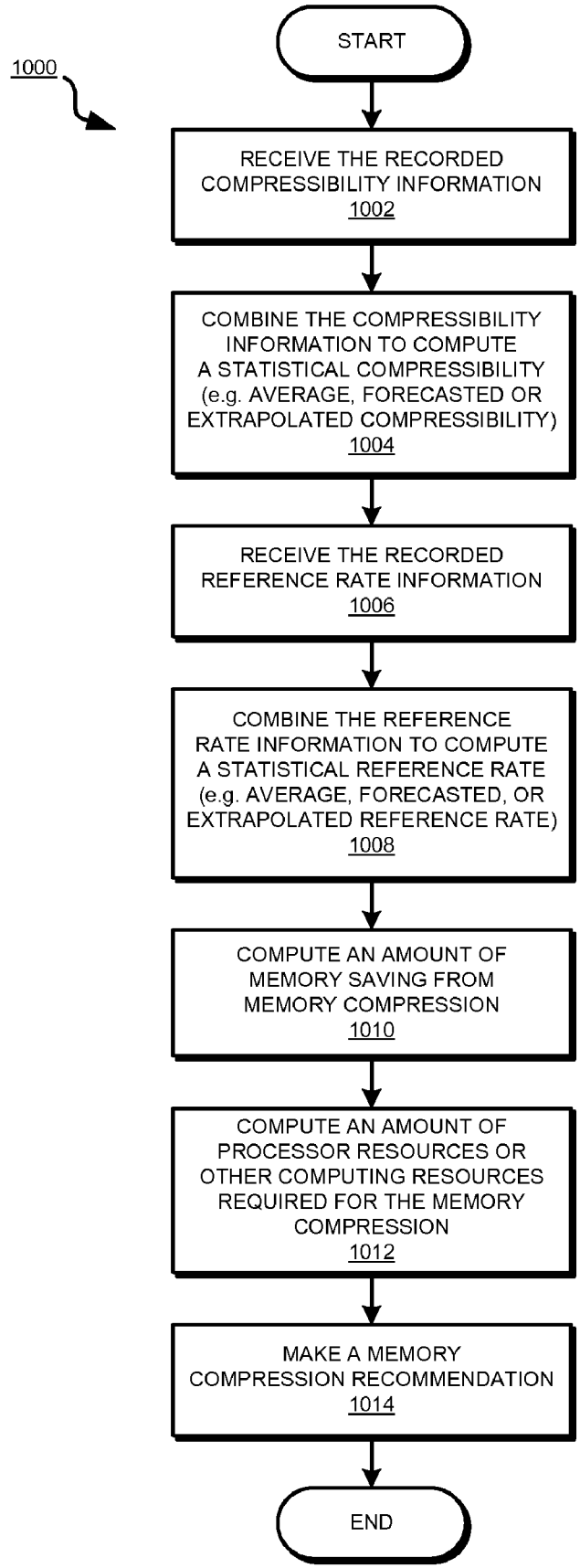
FIG. 10 depicts a flowchart of a process of recommending a memory compression model in accordance with an illustrative embodiment.

With reference to FIG. 10, this figure depicts a flowchart of a process of recommending a memory compression model in accordance with an illustrative embodiment. Process 1000 may be implemented in a monitoring application, such as any of monitoring applications 502 in FIG. 5, 602 in FIG. 6, or 702 in FIG. 7.

Process 1000 begins by receiving the recorded compressibility information about a workload (step 1002). For example, process 1000 may receive such information from the record updated in step 808 in FIG. 8. Process 1000 combines the compressibility information to compute a statistical compressibility of the workload (step 1004).

Process 1000 receives the recorded reference rate information about a workload (step 1006). For example, process 1000 may receive such information from the record updated in step 906 in FIG. 9. Process 1000 combines the reference rate information to compute a statistical reference rate of the workload (step 1008).

Process 1000 computes an amount of memory saving from memory compression in the given workload (step 1010). Process 1000 computes an amount of processor resources and other computing resources required for the memory compression (step 1012).

Process 1000 makes a recommendation about memory compression in the given system (step 1014). Process 1000 ends thereafter.

In one embodiment, process 1000 may make multiple recommendations. For example, process 1000 may suggest that compressing memory by X1 compression ratio may consume Y1 units of processor resources. Process 1000 may also suggest that compressing memory by X2 compression ratio may consume Y2 units of processor resources. X1 and Y1 may both be larger than X2 and Y2 respectively.

Based on additional parameters made available to process 1000, such as by an input to recommendation component 706 in FIG. 7, process 1000 may recommend that a memory compression model that uses a memory compression ratio of X2 should be used. For example, an input to recommendation component 706 in FIG. 7 may be that the computing resources consumed in compression should not exceed a threshold value. Accordingly, process 1000 may recommend a memory compression model that keeps the computing resources consumed in memory compression within the threshold.

As another example, another input to recommendation component 706 in FIG. 7 may place a limit on total processor utilization. Y1 amount of computing resource consumption may cause the processor utilization to exceed the limit, whereas Y2 amount may not. Accordingly, process 1000 may recommend a memory compression model that uses Y2 amount of computing resources.

Modeling memory compression using an embodiment is implementation specific. An implementation may select additional or different parameters, thresholds, or values to bias a recommendation without departing the scope of the invention.

The components in the block diagrams and the steps in the flowcharts described above are described only as examples. The components and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Thus, an apparatus, and computer program product are provided in the illustrative embodiments for modeling memory compression in a data processing system.

Using the embodiments of the invention, a system or application can easily determine whether memory compression will benefit an existing workload. The system or application can also determine the desirable configuration for memory compression considering the memory, processor, and other computing resources related requirements.

Furthermore, the information provided by an embodiment can be determined transparently while the existing workload executes. Using an embodiment avoids costly trial and error experiments for making memory compression decisions as is presently required. Accordingly, the invention makes memory compression significantly easier to deploy. The invention may offer an added benefit of making it easier to quantify the benefits of memory compression, such as to a customer of the feature.

The embodiments can also be extended to operate in conjunction with a workload manager that may manage multiple virtual machines. The workload manager can use a monitoring application according to an embodiment and determine how much memory could be saved in a virtual machine configuration. The workload manager may then employ memory compression for different virtual machines based on the recommendation from an embodiment to reduce the virtual machine's memory requirements. The memory that was made available from reducing one virtual machine's memory requirements may then be used for creating additional virtual machines or for giving high priority virtual machines more physical memory.

The invention can take the form of an entirely hardware embodiment, entirely software embodiment, or an embodiment containing both hardware and software elements. In a preferred embodiment, the invention is implemented in software or program code, which includes but is not limited to firmware, resident software, and microcode.

Furthermore, the invention can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer usable program product comprising a non-transitory computer usable storage medium including computer usable code for modeling memory compression, the computer usable code comprising:

computer usable code for receiving a subset of candidate pages from a set of candidate pages used in executing a workload in a data processing system, a candidate page being compressible uncompressed data in a memory associated with the data processing system;

computer usable code for compressing the subset of candidate pages in a scratch space;

computer usable code for computing a compressibility of the workload based on the compression of the subset of candidate pages;

computer usable code for receiving page reference information of the subset of candidate pages;

computer usable code for determining a memory reference rate of the workload; and computer usable code for presenting a recommendation about a memory compression model for the workload based on the determined memory reference rate of the workload, in the data processing system.

2. The computer usable program product of claim 1, further comprising:

computer usable code for determining a compressibility of the subset of candidate pages by computing a compression ratio of the subset of candidate pages; and computer usable code for recording information of the compressibility of the subset of candidate pages.

3. The computer usable program product of claim 2, further comprising:

computer usable code for repeating the receiving and compressing using a second subset of candidate pages, wherein the computing the compressibility of the workload is based on the compression of more than one subset of candidate pages.

4. The computer usable program product of claim 1, wherein the receiving the page reference information of the subset of candidate pages is for a first period, further comprising:

computer usable code for resetting the page reference information after the first period has elapsed; and computer usable code for repeating the receiving for a second period.

5. The computer usable program product of claim 1, wherein the computer usable code is stored in a computer readable storage medium in a data processing system, and wherein the computer usable code is transferred over a network from a remote data processing system.

6. The computer usable program product of claim 1, wherein the computer usable code is stored in a computer readable storage medium in a server data processing system, and wherein the computer usable code is downloaded over a network to a remote data processing system for use in a computer readable storage medium associated with the remote data processing system.

7. A data processing system for modeling memory compression, the data processing system comprising:

a storage device including a storage medium, wherein the storage device stores computer usable program code; and a processor, wherein the processor executes the computer usable program code, and wherein the computer usable program code comprises:

computer usable code for receiving a subset of candidate pages from a set of candidate pages used in executing a workload in a data processing system, a candidate page being compressible uncompressed data in a memory associated with the data processing system;

computer usable code for compressing the subset of candidate pages in a scratch space;

computer usable code for computing a compressibility of the workload based on the compression of the subset of candidate pages;
computer usable code for receiving page reference information of the subset of candidate pages;
computer usable code for determining a memory reference rate of the workload; and
computer usable code for presenting a recommendation about a memory compression model for the workload based on the determined memory reference rate of the workload, in the data processing system.

* * * * *